(12) United States Patent
Nishiwaki et al.

(10) Patent No.: US 8,046,910 B2
(45) Date of Patent: Nov. 1, 2011

(54) METHOD FOR MANUFACTURING A SURFACE MOUNTED CRYSTAL DEVICE

(75) Inventors: Masakazu Nishiwaki, Saitama (JP); Yasuo Sakaba, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 826 days.

(21) Appl. No.: 11/823,691

(22) Filed: Jun. 28, 2007

(65) Prior Publication Data
US 2008/0072420 A1 Mar. 27, 2008

(30) Foreign Application Priority Data
Jul. 10, 2006 (JP) .................................. 2006-189856

(51) Int. Cl.
*H05K 3/36* (2006.01)
(52) U.S. Cl. .................. 29/830; 29/415; 29/832; 331/68
(58) Field of Classification Search .................. 29/25.35, 29/412, 415, 594, 595, 830–832, 840, 846; 174/565; 310/312, 318, 344; 331/67, 68, 331/116 R, 158; 361/736
See application file for complete search history.

(56) References Cited

U.S. PATENT DOCUMENTS
3,969,640 A * 7/1976 Staudte .......................... 310/344
7,266,869 B2 * 9/2007 Hatanaka et al. ............. 29/25.35

FOREIGN PATENT DOCUMENTS
JP 2002-144048 * 5/2002

* cited by examiner

*Primary Examiner* — Donghai D. Nguyen
(74) *Attorney, Agent, or Firm* — Scott D. Wofsy; Edwards Angell Palmer & Dodge LLP

(57) ABSTRACT

A method of manufacturing a surface mounted (crystal) device comprising: the steps of providing an aggregated sheet material having a plurality of container main bodies lengthwise and crosswise, accommodating at least a crystal piece inside the concavities of the plurality of container main bodies formed in the aggregated sheet material, and then parting the aggregated sheet material into individual container main bodies. The method further includes: the steps of providing annular grooves on outer perimeters between the container main bodies of the aggregated sheet material; positioning an outer peripheral edge of an electrode roller having an inclined face of a seam welder inside the annular groove; abutting the inclined face against a metal cover tacked to the container main body; bonding the metal cover to an aperture end face of the container main body, by seam welding; and then parting the aggregated sheet material into individual container main bodies.

3 Claims, 8 Drawing Sheets

METHOD FOR MANUFACTURING A SURFACE MOUNTED CRYSTAL DEVICE

BACKGROUND OF THE INVENTION

1. Technical Field

The present invention relates to a method of manufacturing a surface mounted crystal device (hereunder "surface mounted device") and an aggregated sheet material used for this method. In particular, the invention relates to a method of manufacturing a surface mounted device in which a metal cover is jointed to each container main body by seam welding, while they are in a state of an aggregated sheet material, and an aggregated sheet material used for this method.

Since surface mounted devices, for example surface mounted resonators or oscillators are small and lightweight, they are accommodated and used especially in portable electronic equipment, as a frequency or time reference source. In recent years, due to these becoming smaller and lower cost, there is a requirement for the planar outside dimensions to be for example less than 3.2 mm×2.5 mm, and for productivity to be high.

2. Prior Art

Figure 6A:
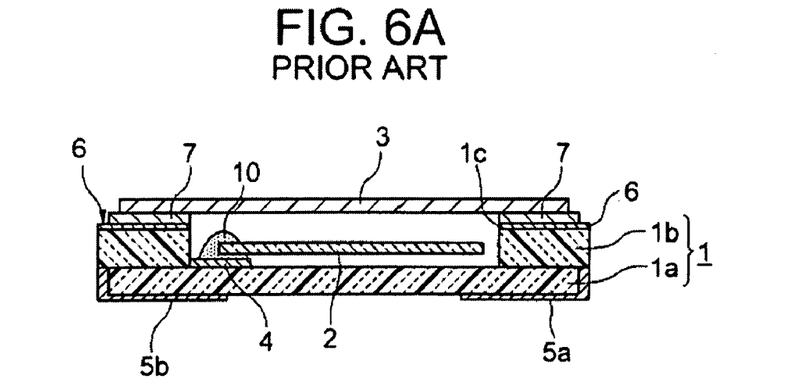
FIG. 6A is a cross-section view.
Figure 6B:
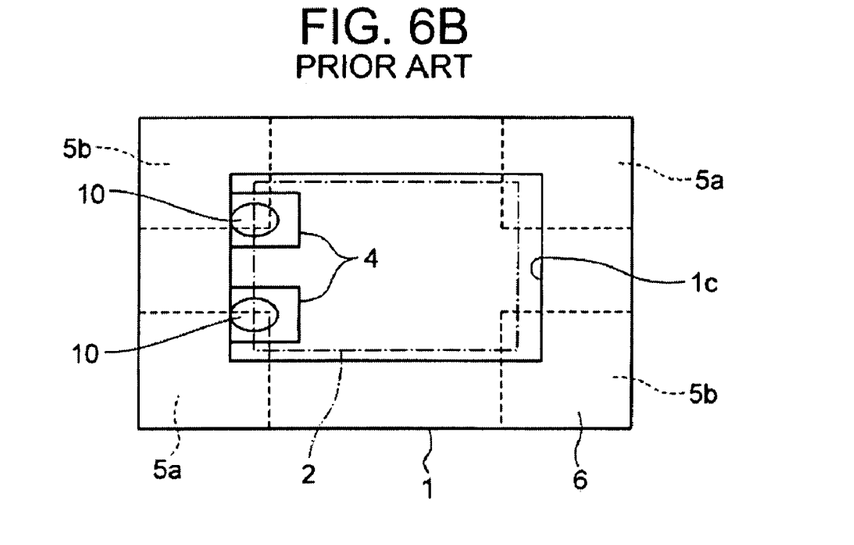
FIG. 6B is a plan view without a cover viewed from above.
Figure 6C:
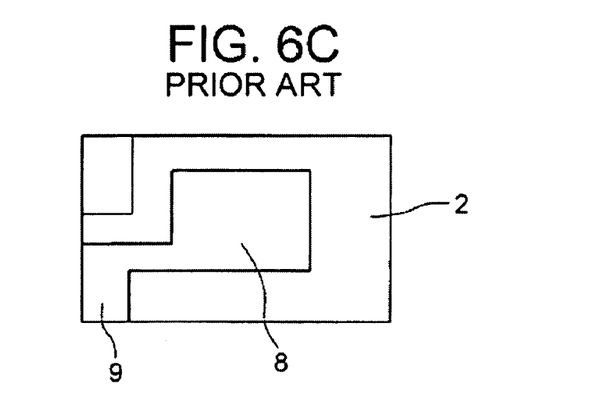
FIG. 6C is a plan view of a crystal piece that is accommodated in a container main body.

FIG. 6 is a drawing for describing a conventional surface mounted device, for example a surface mounted resonator. FIG. 6A is its cross-section view, FIG. 6B is a plan view without a cover, and FIG. 6C is a plan view of a crystal piece accommodated inside a container main body.

In this surface mounted oscillator, a crystal piece 2 is accommodated inside a container main body 1 which has a concave cross-section, and is covered with a metal cover 3 and sealed-encapsulated. The container main body 1 comprises a laminated ceramic substrate made up of a planar first layer 1a, and a frame shape second layer 1b which has an aperture area 1c. Moreover, both sides of one edge portion of the inside bottom surface of the container main body 1 have a pair of crystal terminals 4, the four corners of the outside bottom surface have mounting terminals 5 (5a, 5b), and the aperture end face has a surface electrode 6 for sealing.

The pair of crystal terminals 4 is electrically connected for example to the mounting terminals 5 (5a, 5b) of the diagonal pair through the lamination surface of the first layer 1a and the second layer 1b. The mounting terminals 5 (5a, 5b) of the other diagonal pair are connected to a metal ring 7 comprising a thick metal film that is provided on the surface electrode 6 on the aperture end face, via an annular groove (not shown in the figure) and the lamination surfaces.

The crystal piece 2 has excitation electrodes 8 on both main surfaces, and for example, lead out electrodes 9 are extended on both sides of its one end. The both sides of one end of the crystal piece 2 are fastened to the pair of crystal terminals 4 positioned on the container main body 1, with a conductive adhesive 10, and connected electrically to one pair of mounting terminals 5 (5a, 5b). The metal cover 3 is connected by seam welding to the surface electrode 7 on the aperture end face of the container main body 1, and is electrically connected to the other pair of mounting terminals 5 (5a, 5b) serving as ground terminals.

Figure 7:
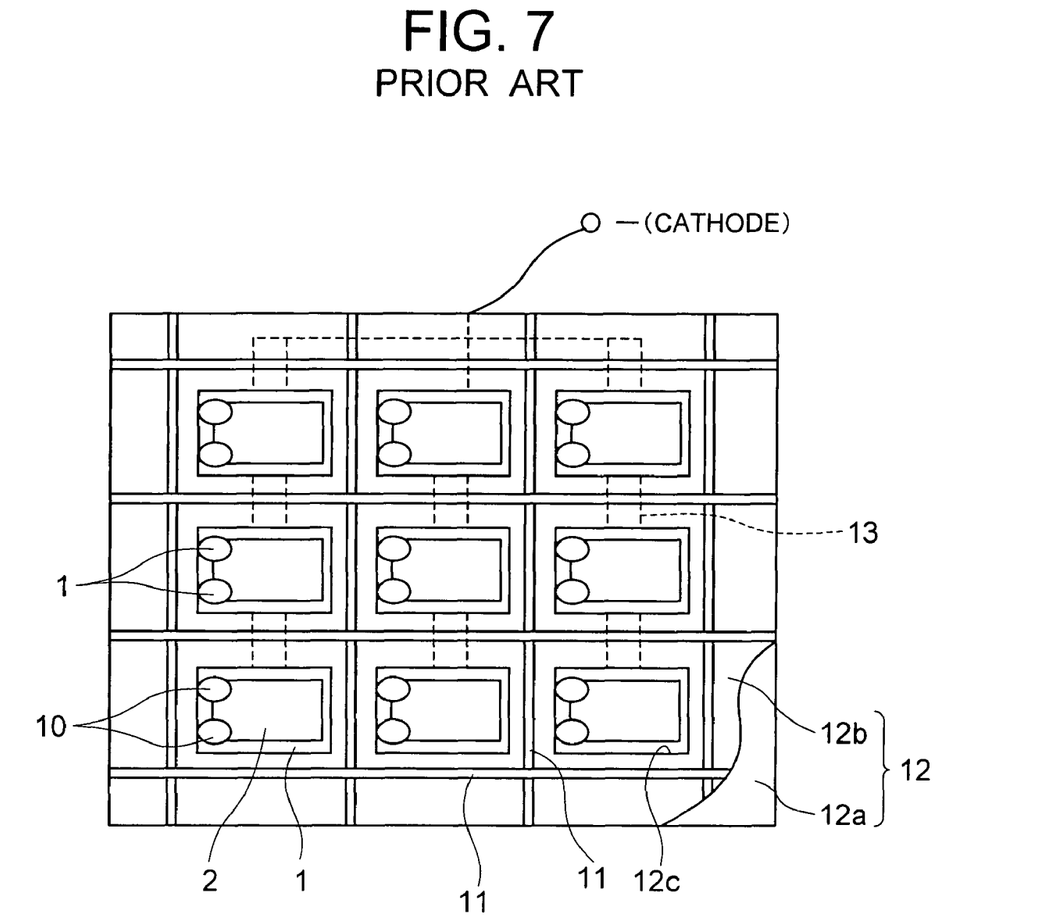
FIG. 7 is a plan view describing a conventional aggregated sheet material in which crystal pieces are accommodated.

In order to manufacture these kinds of surface mounted devices, as shown in FIG. 7, for example, in a state of an aggregated sheet material 12 with several container main bodies 1 partitioned by lengthwise and crosswise V-grooves (parting grooves) 11, at first the aggregated sheet material 12 is parted into individual container main bodies 1 along the lengthwise and crosswise V-grooves 11. Next a crystal piece 2 is accommodated inside each container main body 1. Finally the metal covers 3 are respectively bonded to the individual container main bodies 1.

Here, the aggregated sheet material 12 comprises a planar first layer 12a made of a ceramic sheet, and a second layer 12b that has a plurality of apertures 12c. Furthermore, for each of the container main bodies 1 comprising the first layer 12a and the second layer 12b, there is printed for each of the layers, an underlay pattern of an electrode pattern that includes the aforementioned (FIG. 6) crystal terminals 4, mounting terminals 5, annular grooves, and surface electrodes 6. The underlay pattern (underlay electrode) is composed of for example, tungsten (W) or molybdenum (Mo).

Then, after laminating the first layer 12a and the second layer 12b, and integrally baking, the underlay electrodes of the crystal terminals 4, the mounting terminals 5, and the surface electrode 6 that are exposed on the external surface of the aggregated sheet material 12, are formed by electro plating or electroless plating nickel (Ni) or chrome (Cr), and then gold (Au).

For example, in the case of electro plating, the underlay electrodes of the respective container main bodies 1 are commonly connected electrically through an underlay circuit 13 (refer FIG. 7) provided on the lamination surface. Then, after connecting the underlay circuit 13 to the cathode (−), the aggregated sheet material 12 is immersed in an electrolyte, and nickel (Ni) (or chrome (Cr)) and then gold (Au) are deposited by electro plating onto the exposed underlay electrodes of the respective container main bodies 1.

Figure 8A:
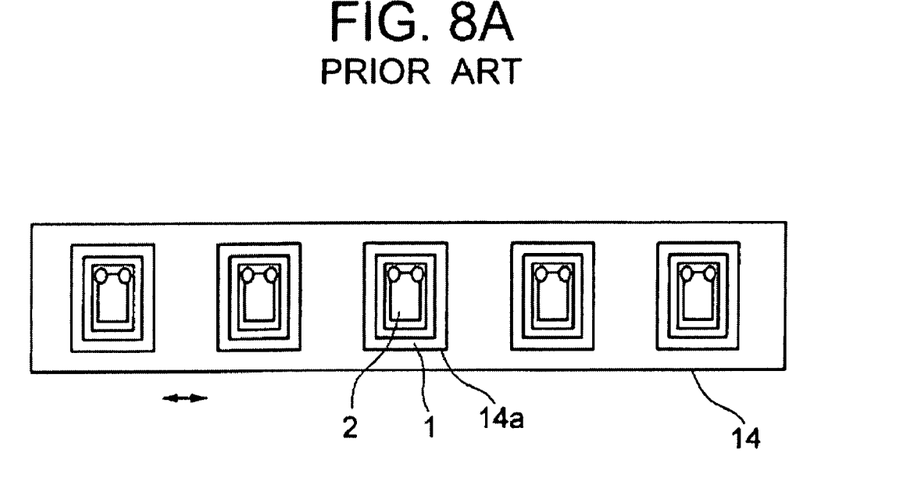
FIG. 8A is a plan view of a carrier plate with crystal pieces accommodated therein.
Figure 8B:
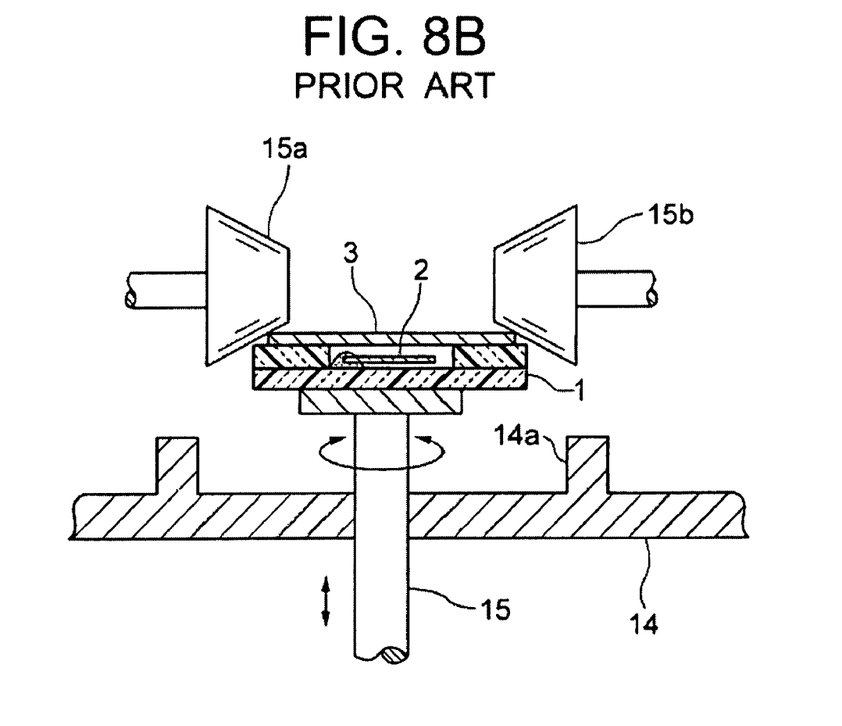
FIG. 8B is a cross-section for describing a seam welding state.

When seam welding the metal cover onto the container main body 1, as shown in FIG. 8A and FIG. 8B, for example, the individual container main bodies 1 that have a crystal piece 2, are accommodated in an aperture part 14a of a carrier plate 14. Then the carrier plate 14 is moved in a direction for seam welding, and the container main body 1 and the metal cover 3 are image recognized, the metal cover 3 is positioned on the container main body 1, and is tacked at two places for example.

Then after tacking, the carrier plate 14 is further moved, a movable rod 15 is raised, and the container main body 1 is pushed up, so that the opposite sides of the metal cover 3 are abutted against a pair of electrode rollers 15a and 15b. Then between the pair of electrode rollers 15a and 15b is electrified, and while moving the container main body 1 and the metal cover 3, the abutted pair of opposite sides are welded by Joule heat. Next the movable rod 15 is rotate through 90 degree, and the electrode rollers 15a and 15b are abutted against the other pair of opposite facing sides, and similarly welded.

Problems with the Prior Art

However in the manufacturing method for the conventional surface mounted oscillator of the abovementioned configuration, in positioning the metal cover 3 on the container main body 1 which is accommodated in the aperture part 14a of the carrier plate 14, using image processing, it is necessary to respectively position for each individual container main body 1.

In the conventional example, since the container main body 1 is accommodated in the aperture part 14a of the carrier plate 14, the approximate seam welding position of the container main body 1 is determined. However the dimensions of the aperture part 14a of the carrier plate 14 are greater that the dimensions of the container main body 1, and looseness occurs due to a gap between the inner perimeter of the aperture part 14a and the outer perimeter of the container main body 1. Consequently the position and posture of the container main body 1 inside of the aperture part 14a are different for each container main body 1. Therefore it is necessary to recognize and position each container main body 1.

In particular, as the planar outside dimensions of the surface mounted device become smaller, for example as this becomes less than the existing standard size of 3.2 mm×2.5 mm, the gap between the inner perimeter of the aperture part 14a and the outer perimeter of the container main body 1 becomes relatively greater. Hence, the orientation error of the container main body 1 inside of the respective aperture parts 14a becomes greater. Therefore, positioning of the metal cover 3 after image recognition, with respect to the container main body 1 also takes time, and orientation (position) control becomes difficult.

Also in the conventional example, after parting the aggregated sheet material 12 into individual container main bodies 1, and accommodating the crystal pieces 2 in the respective container main bodies 1, the metal cover 3 is seam welded onto the container main body 1. Consequently, it is necessary to accommodate the container main bodies 1 in the carrier plate 14 after the aggregated sheet material 12 has been parted, and the manufacturing processes become many. For these reasons, in the aforementioned conventional manufacturing method there is a limit to improvement in productivity. Also in the case of parting into individual container main bodies after accommodating the crystal piece 2 in the aggregated sheet material 12, there are the same problems.

Object of the Invention

An object of the present invention is to simplify positioning of the metal cover with respect to the container main body and thus reduce the manufacturing processes, and to provide a high productivity method of manufacturing surface mounted devices and an aggregated sheet material suitable for this.

SUMMARY OF THE INVENTION

The method of manufacturing a surface mounted device of the present invention is one that in a method of manufacturing a surface mounted crystal device comprising: the steps of providing an aggregated sheet material in which a plurality of container main bodies having a concave cross-section are provided lengthwise and crosswise, accommodating at least a crystal piece inside concavities of the plurality of container main bodies formed in the aggregated sheet material, and then parting the aggregated sheet material into individual container main bodies, further includes: the steps of providing annular grooves on outer perimeters between the container main bodies of the aggregated sheet material; positioning an outer peripheral edge of an inclined face of an electrode roller of a seam welder inside the annular groove; abutting the inclined face against a metal cover on the container main body; bonding the metal cover to an aperture end face of the container main body, by seam welding; and then parting the aggregated sheet material into individual container main bodies.

The present invention has a construction such that in an aggregated sheet material for crystal devices, in which a plurality of container main bodies having concavities for accommodating at least a crystal piece are provided lengthwise and crosswise, and which comprises a ceramic sheet of a planar first layer constituting bottom walls of the concavities, and a second layer that has aperture parts constituting frame shape walls of the concavities, on the outer periphery of the container main bodies there is provided annular grooves around the container main bodies, for positioning an outer peripheral edge of an electrode roller having an inclined surface of a seam welder.

According to this construction of the present invention, the outer peripheral edge of the electrode roller for seam welding can be positioned (inserted) and rotated in the annular grooves that are provided in the outer perimeter between the container main bodies of the aggregated sheet material. Consequently, the metal cover can be bonded to each of the container main bodies, while they are in the state of the aggregated sheet material.

In the manufacturing method of the present invention, there is no image recognition for positioning each container main body as with the conventional method of manufacturing a surface mounted device, and provided that a plurality of points of the aggregated sheet material are recognized, the position of each of the container main bodies can be reliably ascertained by calculation for example. Furthermore, since it is sufficient to positioned the metal cover on the container main body in conformity with the calculation result, the time for positioning can be shortened, and the positioning accuracy is enhanced. At this time, the positioned metal covers are basically identically positioned. Therefore these can be positioned mechanically all together, without controlling the positions for each container main body as with the conventional example.

Moreover, the sequence of processes from accommodating a crystal piece in a container main body to sealing with a metal cover, can proceed while in the state of the aggregated sheet material. Furthermore, since this is finally parted into individual container main bodies (surface mounted devices), the process at the time of seam welding, of for example accommodating the respective container main bodies in the aperture parts of the carrier plate 14, becomes unnecessary. Therefore, due to this, productivity is enhanced.

According to the structure of the present invention, the annular grooves are provided on the outer perimeter between the container main bodies. Therefore, the outer peripheral edge of the electrode rollers for seam welding can be positioned (inserted) in the annular grooves and rotated. Moreover, an aggregated sheet material in which the metal cover can be easily and reliably bonded to the respective container main bodies can be provided.

In the present invention, the aggregated sheet material comprises a ceramic sheet comprising a planar first layer constituting a bottom wall of concavities of the container main bodies, and a second layer which has aperture parts constituting frame shape walls of the concavities, and in outer perimeters between the aperture parts of the second layer are formed grooves in long side and/or short side directions; and the groove length of either the long side direction or short side direction is made longer than the length of either of the aperture parts, and after laminating the first layer and second layer and firing, a continuous groove is provided in the second layer in a side direction different to that of the side in which the either one groove is formed, to form the annular grooves.

According to this, in for example the long side direction of the second layer, the groove longer than the length of container main body is formed. Therefore, after firing, if a continuous groove is formed in only the short side direction, the annular grooves can be formed. This is due to the necessity of connecting one of the sides to the outer frame, because the adjacent aperture parts cannot be connected if the annular grooves are provided beforehand in the ceramic sheet state. Moreover, the annular grooves can be provided after firing the first layer and the second layer. However in this case since the grooves are provided in both side directions, operability is poor.

Furthermore, in the present invention, the aperture end faces of the plurality of container main bodies have surface electrodes, and electrode patterns that are respectively formed for the container main bodies are common-connected through the surface electrodes, and at the time of forming the annular grooves, the surface electrodes are cut off and the electrode patterns of the container main bodies are respectively formed independently.

According to this construction, since the electrode patterns formed on each container main body are common-connected by the surface electrode, metal can be easily deposited on the electrode pattern by electrode plating. Moreover, since the surface electrodes of the container main bodies are cut off at the time of forming the annular electrode, the electric current while seam welding in the aggregated sheet material does not branch to the electrode pattern of the container main bodies. Consequently, the seam welding of the metal cover to the container main bodies in the aggregated sheet material is made reliable. Of course, after accommodating the crystal piece in the container main body before seam welding, frequency adjustment can also be done for each container main body.

In the present invention, the planar outside dimensions of the container main body are less than 3.2 mm×2.5 mm. As a result, compared to the conventional case where the container main body is accommodated for example in the aperture part of the carrier plate, the looseness becomes relatively smaller than for where the planar outside dimensions of the container main body are larger than this, and the positioning effect is further enhanced.

BRIEF DESCRIPTION OF THE DRAWINGS

FIG. 1 is a diagram describing one example of a method of manufacturing a surface mounted device of the present invention, wherein

FIG. 3 is a diagram describing the aggregated sheet material used in the present invention, wherein

FIG. 4 is a diagram describing the aggregated sheet material used in the present invention, wherein

FIG. 6 is a diagram describing a conventional surface mounted oscillator device, wherein

FIG. 8 is a diagram describing a conventional manufacturing method, wherein

DETAILED DESCRIPTION OF THE PREFERRED EMBODIMENTS

FIG. 1 through FIG. 5 are (surface mounted device) manufacturing process diagrams for describing one embodiment of a surface mounted oscillator of the present invention.

The method of manufacturing the surface mounted oscillator of this example comprises firstly preparing an aggregated sheet material 12 in which a plurality of container main bodies 1 having concave cross-section shapes are provided lengthwise and crosswise and integrated. In this aggregated sheet material 12, as shown in FIG. 1B, a planar first layer 12a comprising a ceramic sheet, and a second layer 12b which has a plurality of aperture parts 12c for forming concave parts, are laminated.

Figure 1A:
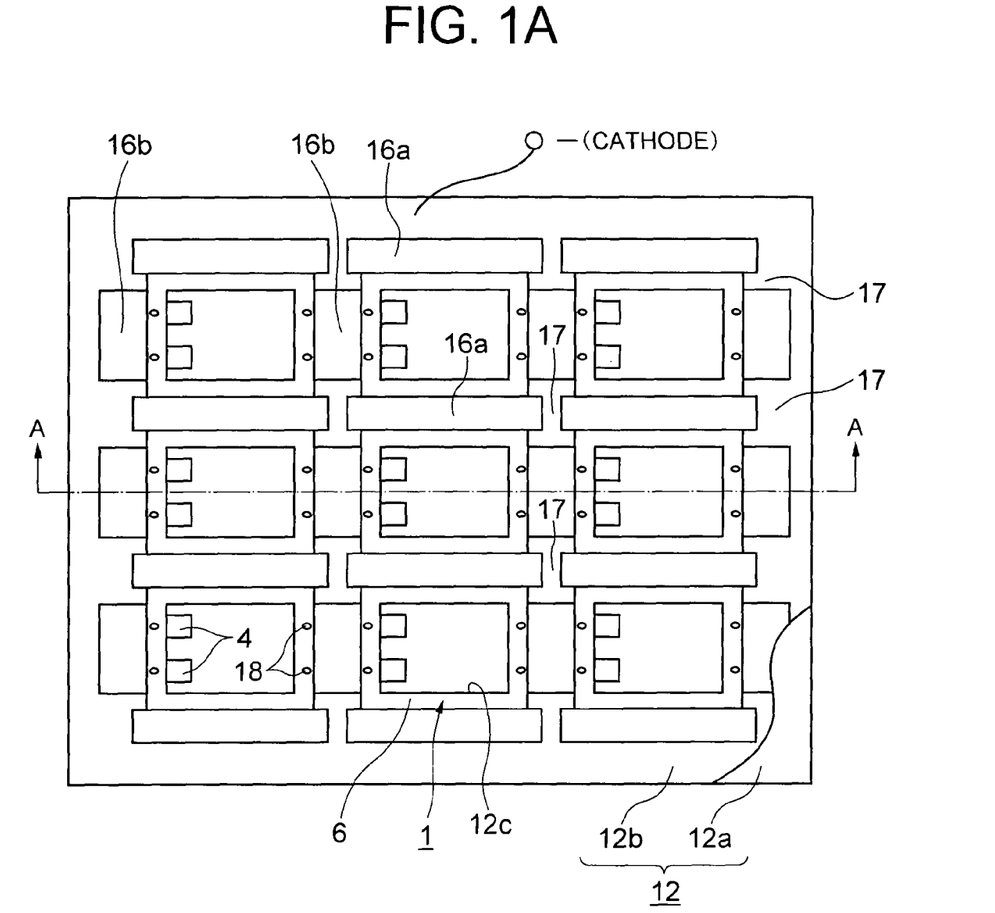
FIG. 1A is a plan view of an aggregated sheet material for use in this manufacturing method.
Figure 1B:
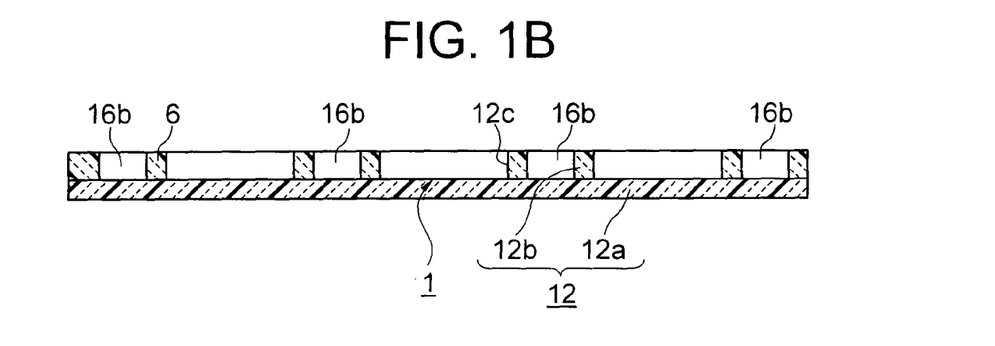
FIG. 1B is a cross-section view on arrows A-A of FIG. 1A.

As shown in FIG. 1A, here on the long side and the short side between the adjacent aperture parts 12c formed in the second layer 12b, is provided annular grooves 16a and 16b for partitioning each of the container main bodies 1. The length of the annular groove 16a for the long side direction is longer than the long side of the container main body 1, and the length of the annular groove 16b for the short side direction is shorter than the short side of the container main body 1. As a result, the second layer 12b of the aggregated sheet material 12 is coupled together by I-shape junctions 17 at each of the four corners.

On each ceramic sheet (first layer 12a and second layer 12b) for each container main body 1, is integrally formed by printing, an underlay pattern (W (tungsten) or Mo (molybdenum)) for electrode patterns comprising as shown in FIG. 6; crystal terminals 4 including annular grooves, mounting terminals 5, and surface electrodes 6 on aperture end faces.

In this example, the underlay electrodes of the crystal terminals 4 and the mounting terminals 5 are electrically connected to the underlay electrode of the surface electrode 6 via annular grooves (electrode annular grooves) 18 or the like. The underlay electrodes of the surface electrodes 6 which are formed on each of the container main bodies 1 are electrically commonly connected to each other through the surface of the I-shape junction 17 portions.

Next, after laminating the first layer 12a and the second layer 12b, the baked aggregated sheet material 12 is immersed in an electrolyte. Then, with the underlay electrode of the surface electrode 6 as a cathode (−), Ni (nickel) (or Cr (chrome)) and Au (gold) are deposited by electro plating onto the externally exposed underlay pattern of the crystal terminals 4, the mounting terminals 5, and the surface electrode 6 (refer to FIG. 1).

Figure 2:
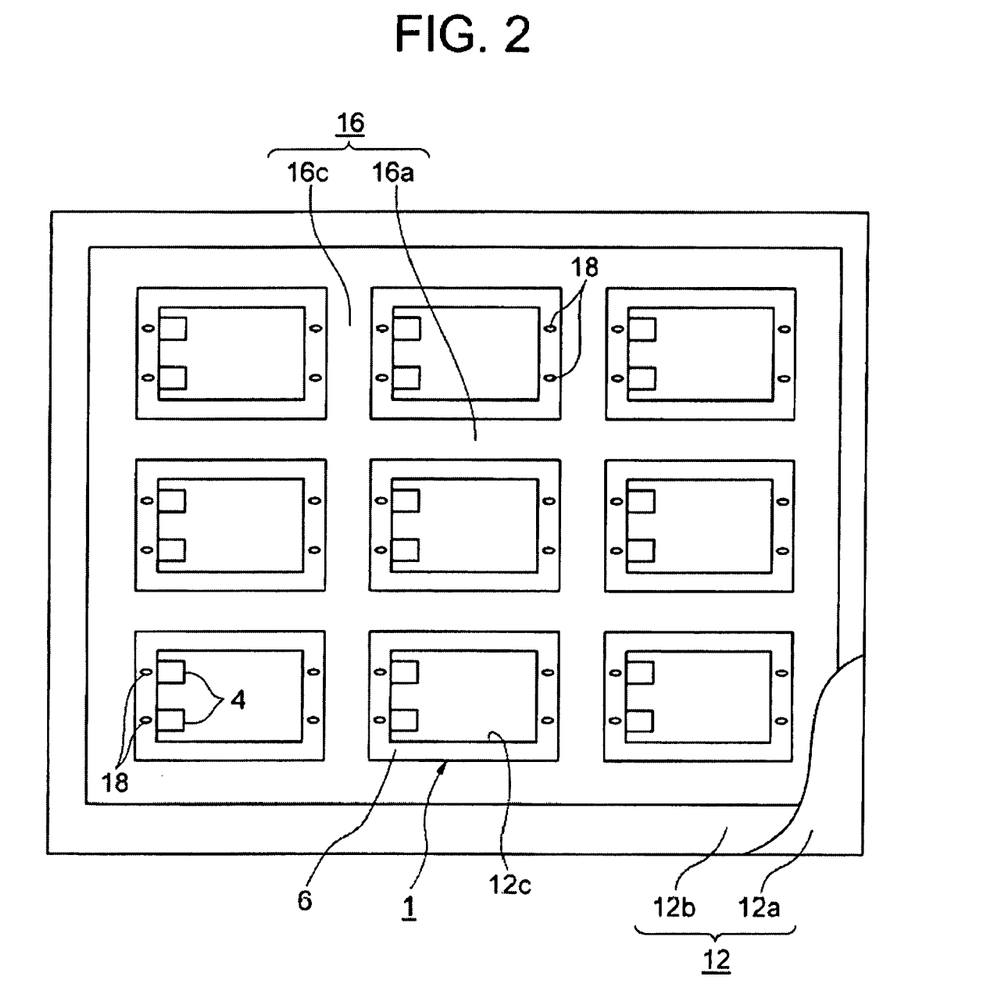
FIG. 2 is the plan view of the aggregated sheet material for use in the manufacturing method of the present invention, showing a state with a second layer of a ceramic sheet peeled off and a first layer exposed.

Next, as shown in FIG. 2, the space between the short edge directions of each container main body 1 of the aggregated sheet material 12 having the electro plated electrode pattern, is half cut by dicing from the surface of the substrate 12, to remove the I-shape junctions 17 of the second layer 12b. As a result, continuous grooves 16c are formed, and together with the annular grooves 16a provided in the long side direction of the second layer 12b, annular grooves 16 around the each of the container main bodies 1 are provided in the aggregated sheet material 12.

As a result, the electrical connection between each container main body 1 through the surface electrode 6 is disconnected, and the electrode patterns of each container main body 1 become respectively independent. On the surface electrode 6 on the aperture end face of each container main body 1, before or after immersing into the electrolyte or after forming the annular grooves 16, a metal ring is bonded by using silver solder (not shown in the figure). As a result, as shown in FIG. 2, the second layer 12b becomes just a frame part.

Figure 3A:
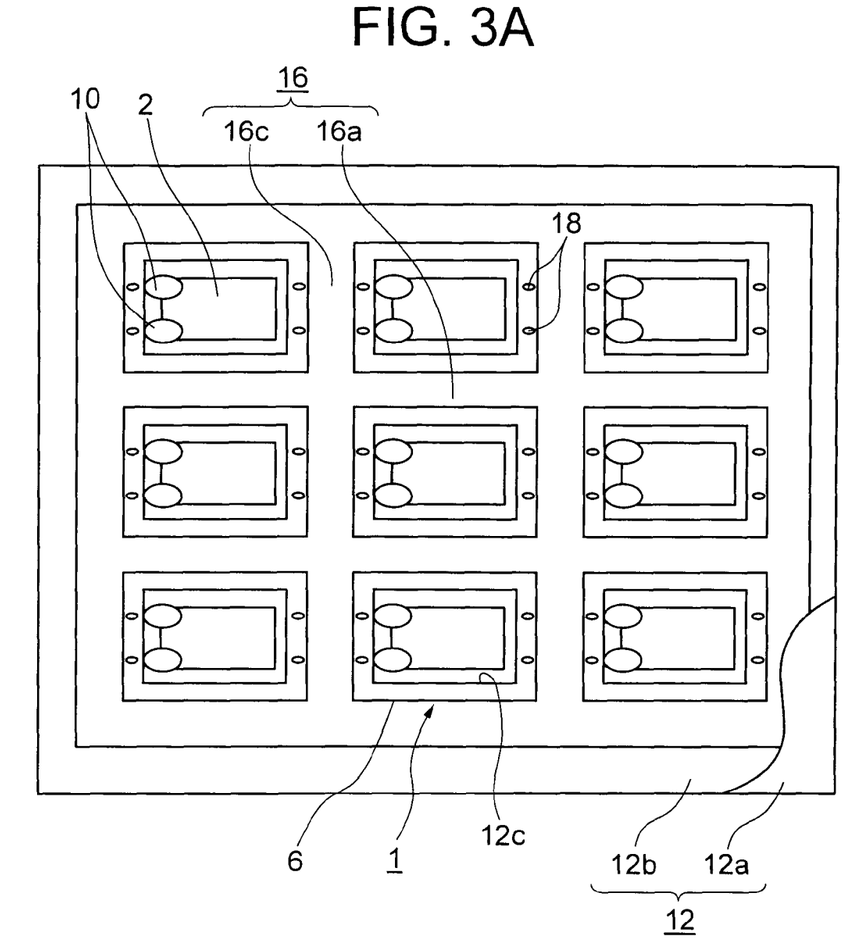
FIG. 3A is a plan view of the aggregated sheet material with a crystal piece accommodated therein.
Figure 3B:
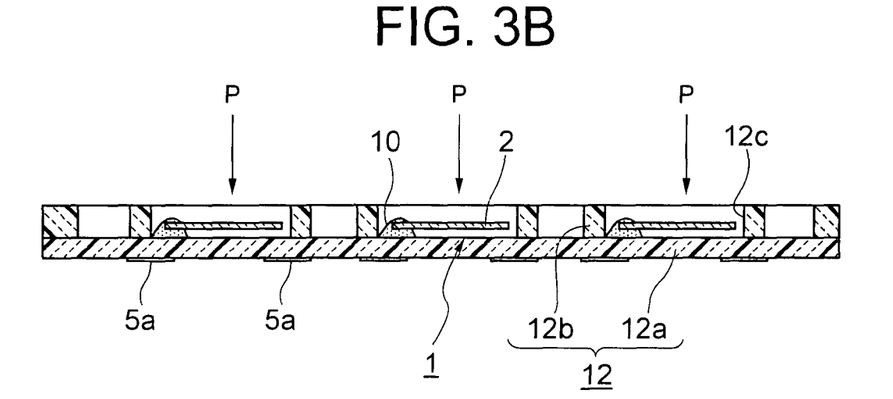
FIG. 3B is a cross-section view thereof.

Next, as shown in FIG. 3A and FIG. 3B, a crystal piece 2 is fastened to the bottom surface of the recessed part of each container main body 1 formed on the aggregated sheet material, with a conductive adhesive 10. Then a probe (not shown in the diagram) is contacted against a pair of mounting terminal 5a of the outer bottom surface of the aggregated sheet material 12 that is connected to the crystal terminals 4 (refer to FIG. 1A) in the electrode patterns of each container main body 1, and while measuring the oscillation frequency, for example gas ions P are irradiated onto the excitation electrode 8 (refer to FIG. 6C) to adjust the oscillation frequency.

Figure 4A:
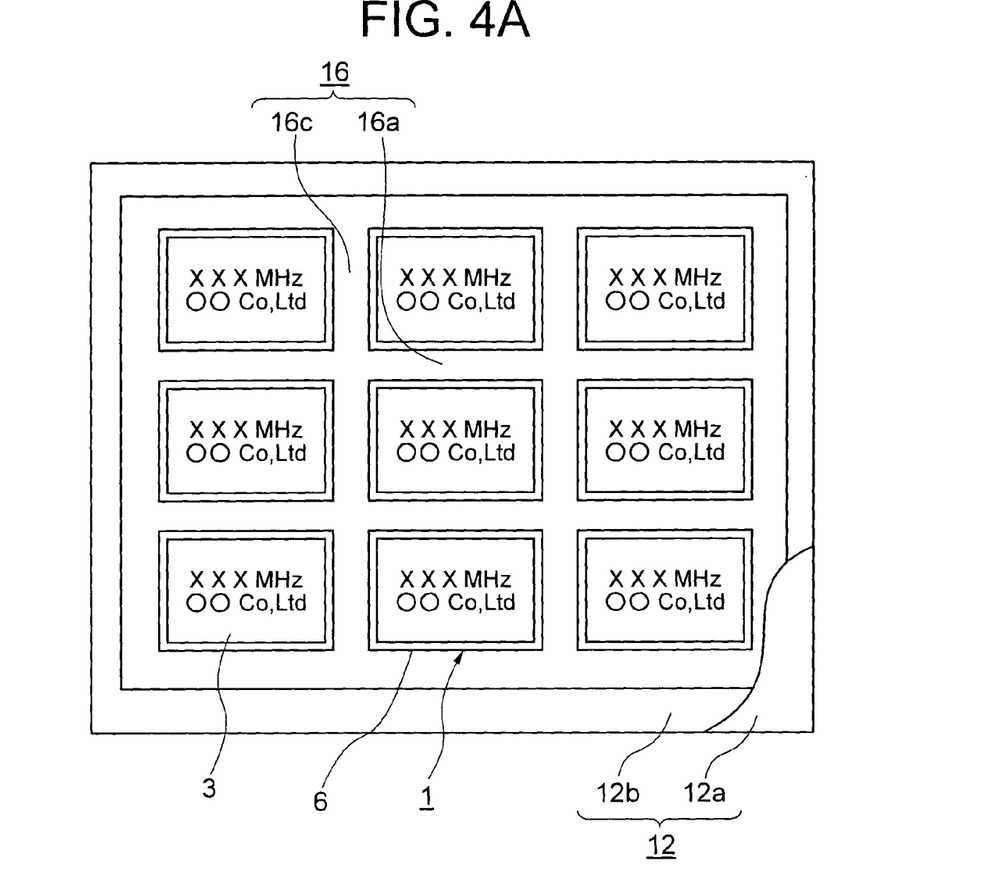
FIG. 4A is a plan view of the aggregated sheet material with a metal cover positioned.

Furthermore, as shown in FIG. 4A, a metal cover 3 labeled with the frequency and place of origin, is seam welded to the aperture end face of each container main body 1 of the aggregated sheet material 12. Here, compared to the conventional manufacturing method that welds the metal covers 3 individually to each of the container main bodies 1 after parting, the width of the electrode rollers 15a, 15b is reduced, and the inclined faces of the electrode rollers 15a and 15b are made more acute angles ($\theta$).

In addition, in this example, the width (W) of the electrode rollers 15a and 15b is 1 mm to 2 mm, and the angle $\theta$ of the inclined faces is 2 to 5 degrees. In contrast to this, in the conventional example the width (W) of the electrode rollers 15a and 15b is generally 0.3 mm to 10 mm, and the angle $\theta$ of the inclined faces is 8 degree. In this example, the planar outside dimensions of the container main body 1 that is formed on the aggregated sheet material 12 is 3.2 mm×2.5 mm, and the annular groove width is 3 mm.

Figure 4B:
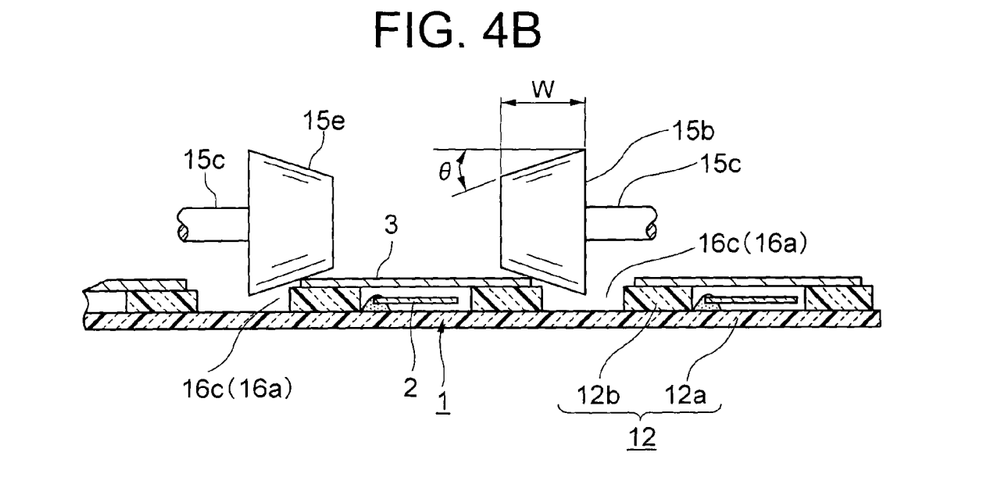
FIG. 4B is a cross-section describing a seam welding state.

Then, the inclined faces of the electrode rollers 15a and 15b are abutted against the metal cover 3 as shown in FIG. 4B, and the outer peripheral edge of the inclined face on the rotor shaft 15c side is positioned inside the annular groove 16c (16a) and moved while rotating. First a pair of long edge sides are seam welded, and then a pair of short edge sides are seam welded. Here, prior to this, a part of the metal cover 3 is positioned (tacked) on the container main body 1, after which it is seam welded.

Figure 5:
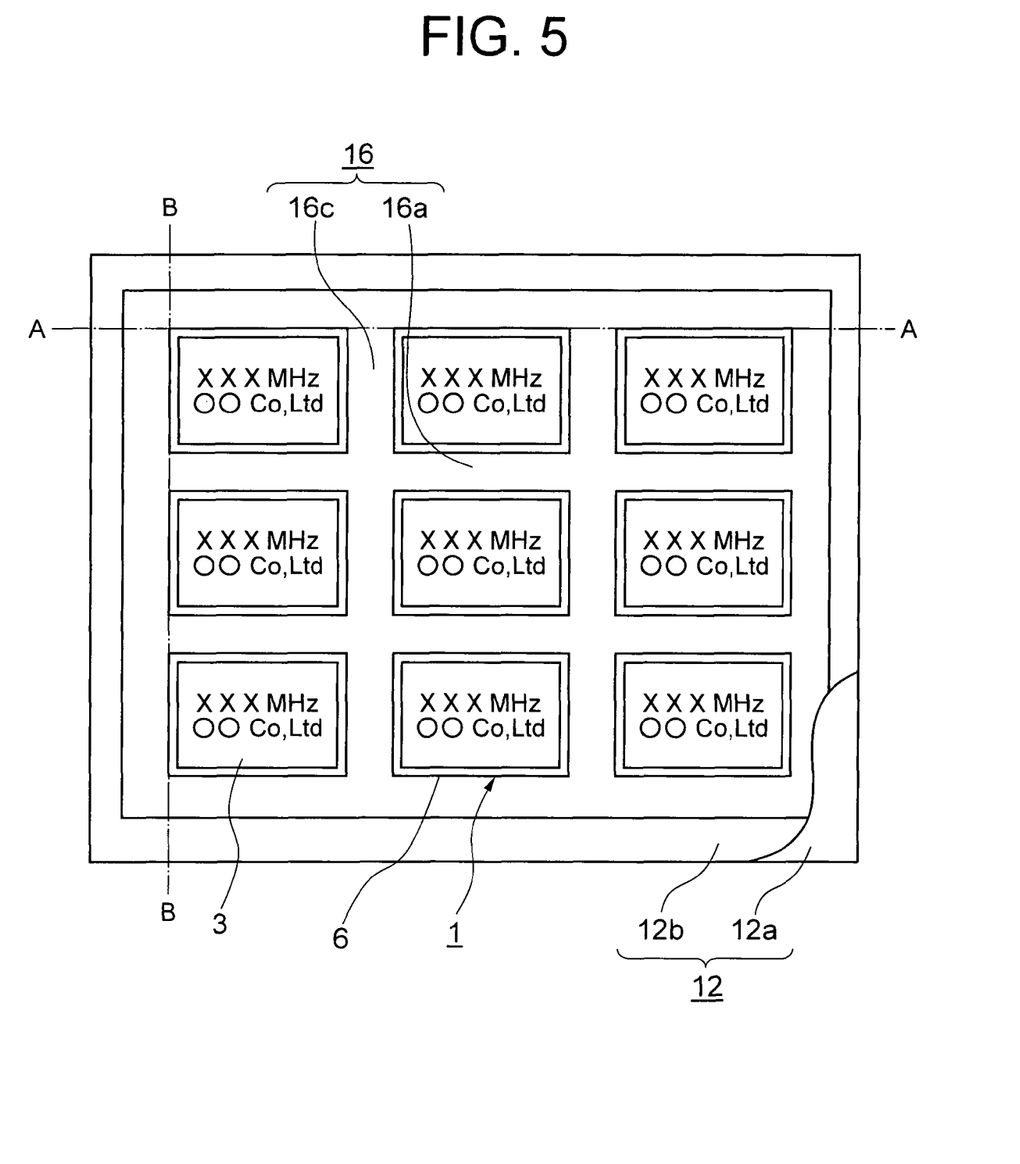
FIG. 5 is a plan view describing a procedure for parting the aggregated sheet material of the present invention, with the covers bonded to the container main bodies.

Finally, as shown by the lines A-A and B-B in FIG. 5, the lengthwise and crosswise of the aggregated sheet material 12 along the outer shape of the container main body 1 is cut off (parted) by a dicing saw. As a result, individual surface mounted oscillators (container main bodies 1) can be obtained. In this case, here since the width of the annular grooves 16 (16a, 16b) is wide, the outer peripheries of the container main body can be respectively diced. It is also possible to cut the annular grooves 16 (16a, 16c) using a wider dicing saw, however from the point that this may produce burrs or cracking, the present embodiment is advantageous.

According to such a construction, since the annular grooves 16 (16a, 16c) are formed in the outer perimeter between each container main body 1 of the aggregated sheet material 12, the outer peripheral edge of the seam welder electrode rollers 15a and 15b can be positioned (inserted) into the annular grooves 16 (16a, 16c) and rotated. Therefore, in the state of the aggregated sheet material 12, the metal covers 3 can be individually welded by a seam welder, to each container main body 1 before parting.

In this case, the container main body 1 is beforehand aligned and positioned lengthwise and crosswise in the aggregated sheet material 12. Therefore, unlike the conventional method, it is not necessary to recognize the image for each individual container main body 1, and once the multiple points of the aggregated sheet material 12 have been recognized by the image, the position of each container main body can be ascertained by calculation for example. Then, based on the calculation, the metal covers 3 can be positioned mechanically in the same posture on the container main bodies 1. Therefore, the positioning time can be reduced, and positioning accuracy is enhanced.

Moreover, the series of processes from accommodating a crystal piece 2 to sealing the container main body 1 by the metal cover 3, is executed in a state of the aggregated sheet material 12 prior to parting, and finally the aggregated sheet material 12 is parted into the individual container main bodies (surface mounted devices). Therefore when seam welding the metal cover 3, the process of accommodating each container main body 1, for example in the aperture part of the carrier plate 14, as in the conventional example, is not necessary, and hence productivity is increased.

Also in the manufacturing method of the crystal device of the present invention, the groove 16a that is longer than the length of the container main body 1 is formed beforehand in for example the long side direction of the second layer 1b of the aggregated sheet material 12. Therefore, after firing the first layer 1a and the second layer 1b, if the groove 16c is only provided in the short side direction, the annular grooves 16 can be formed as a whole.

In the ceramic sheet state, it is sufficient if the annular grooves 16 are provided beforehand in the second layer 1b. However, in this case, the adjacent aperture parts (frame parts) cannot be connected to each other, and their respective frame parts become stand-alone. Therefore, one of the edges must be connected to the outer frame to make it sheet form. Moreover, the annular grooves 16 may also be provided after laminating and firing of the first layer 12a and the second layer 12b. However, in this case continuous grooves 16a and 16c must be provided in both side directions, and hence workability is poor.

Furthermore, in the present invention, the electrode patterns formed on each of the container main bodies are commonly connected through the surface electrode 6. Therefore, the metal (in this example Ni (nickel) and Au (gold)) can be easily deposited on the electrodes by electro plating. Moreover, the surface electrodes 6 between each container main body 1 are parted when forming the ring electrode 16. Consequently, before seam welding, for each container main body 1 that accommodates a crystal piece 2, the oscillation frequency can be adjusted by an ion beam or the like. Moreover, the electric current at the time of seam welding in the aggregated sheet material 12 will not branch to the electrode patterns of each container main body 1. Therefore, the seam welding of the metal covers 3 to the respective container main bodies 1 is more reliable.

Also in the case of accommodating the container main body 1 into the aperture part of a carrier plate as in the conventional manufacturing method, the smaller the planar outside dimensions of the crystal piece 2, the greater the looseness. In the present invention however, since the planar outside dimensions are 3.2 mm×2.5 mm, the metal cover 3 can be positioned in a state where each container main body 1 is integrated in the aggregated sheet material 12.

Furthermore, in the manufacturing method of the present invention, the aggregated sheet material 12 shown in this example is used, and the annular grooves 16 are provided on the outer periphery between each container main body 1. Therefore, the outer peripheral edges of the electrode rollers 15a and 15b of the seam welder can be positioned (inserted) into the annular grooves 16 and rotated. Consequently, the metal cover 3 can be welded onto each container main body 1, in the aggregated sheet material 12 state.

Moreover, in the abovementioned example, the present invention is described as a surface mounted oscillator. However, the present invention can be similarly applied to the case of a surface mounted device where for example a surface mounted oscillator that accommodates an IC chip (not shown in the drawings) together with a crystal piece 2 is formed. However, the mounting terminals 5 in the method of manufacturing a surface mounted device for this case, will be for the output, the earth, the power supply and the like.

What is claimed is:

1. A method of manufacturing a surface mounted crystal device, the method comprising the steps of:
   providing an aggregated sheet material in which a plurality of container main bodies having concavities are provided lengthwise and crosswise, accommodating at least a crystal piece inside said concavities of the plurality of container main bodies formed in said aggregated sheet material;
   providing annular grooves on outer perimeters between said container main bodies of said aggregated sheet material;
   positioning an outer peripheral edge of an inclined face of an electrode roller of a seam welder inside said annular groove;
   abutting said inclined face against a metal cover tacked to said container main body;
   bonding said metal cover directly to said aggregated sheet material on an aperture end face of said container main body, by seam welding using the electrode roller positioned inside said annular groove; and
   parting said aggregated sheet material into individual container main bodies.

2. A method of manufacturing a surface mounted crystal device according to claim 1, wherein said aggregated sheet material comprises a ceramic sheet comprising a planar first layer constituting a bottom wall of concavities of said plurality of container main bodies, and a second layer which has aperture parts constituting frame shape walls of said concavities, and in outer perimeters formed between the aperture parts of said second layer are formed grooves in long side and/or short side directions; and the length of the groove in either said long side direction or short side direction is made longer than the length of either of said aperture parts, and after laminating said first layer and second layer and firing, a continuous groove is formed in a side direction different to that of the side in which said either one groove is formed, to form said annular grooves.

3. A method of manufacturing a surface mounted crystal device according to claim 2, wherein the aperture end faces of said plurality of container main bodies have surface electrodes, and electrode patterns that are respectively formed for said container main bodies are common-connected through said surface electrodes, and at the time of forming said annular grooves, said surface electrodes are cut off and the electrode patterns of said container main bodies are respectively made independent.

* * * * *